United States Patent [19]

Charmakadze et al.

[11] 4,153,905
[45] May 8, 1979

[54] SEMICONDUCTOR LIGHT-EMITTING DEVICE

[76] Inventors: Revaz A. Charmakadze, prospekt Vazha Pshavela, 6 kvartal, korpus 24, kv. 23; Rafael I. Chikovani, prospekt Vazha Pshavela, 51, korpus 8, kv. 1, both of Tbilisi, U.S.S.R.

[21] Appl. No.: 891,166

[22] Filed: Mar. 28, 1978

[30] Foreign Application Priority Data

Apr. 4, 1977 [SU] U.S.S.R. .............................. 2468614

[51] Int. Cl.² .......................................... H01L 29/16
[52] U.S. Cl. ........................................ 357/16; 357/17; 357/61; 357/4
[58] Field of Search ...................... 357/17, 18, 16, 61, 357/4

[56] References Cited
U.S. PATENT DOCUMENTS

| 3,783,353 | 1/1974 | Pankove | 317/235 R |
| 3,819,974 | 6/1974 | Stevenson | 313/499 |
| 3,849,707 | 11/1974 | Braslau | 357/17 |
| 3,852,796 | 12/1974 | Cuomo | 357/16 |
| 3,865,655 | 2/1975 | Pankove | 148/189 |
| 3,869,322 | 4/1975 | Cuomo | 148/188 |
| 3,922,703 | 11/1975 | Pankove | 357/17 |
| 4,095,331 | 6/1978 | Rutz | 29/589 |

OTHER PUBLICATIONS

Rutz, I.B.M. Tech. Discl. Bull., vol. 19, No. 10, Mar. 1977, p. 4049.

Primary Examiner—Martin H. Edlow
Attorney, Agent, or Firm—Steinberg & Blake

[57] ABSTRACT

A semiconductor light-emitting device comprising a sapphire substrate, an epitaxial layer of monocrystalline semiconductor p-type gallium nitride deposited on the substrate, and a layer of semiconductor-type aluminum nitride, deposited on the semiconductor gallium nitride layer and forming an injecting heterojunction therewith. The device emits bright blue light.

4 Claims, 1 Drawing Figure

U.S. Patent  May 8, 1979  4,153,905
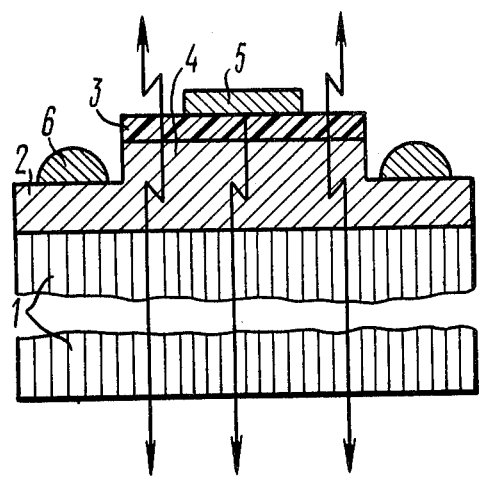

SEMICONDUCTOR LIGHT-EMITTING DEVICE

FIELD OF THE INVENTION

The present invention relates to semiconductor devices, and more particularly to semiconductor light-emitting devices.

The invention can most advantageously be used in semiconductor light-emitting injection devices, displays, arrays, color television and control circuits operating in constant or pulse modes.

BACKGROUND OF THE INVENTION

There is known a planar semiconductor light-emitting device in which an insulating polycrystalline layer of gallium nitride GaN is deposited on a p-type silicon substrate by the high-frequency sputtering technique, and a transparent layer of indium oxide is in contact with the insulating layer.

In the gallium nitride layer, at electric field $E=10^6$ V/cm and supply voltage $U=10$ to 30 V, recombination of the injected charge carriers takes place, causing emission in the form of a pale-blue light having a critical wavelength of 0.48 microns.

A disadvantage of this prior-art device is the high electric field intensity which is close to the breakdown value, equal to about $10^7$ V/cm, and is due to the mechanism of the recombination of opposite charges into gallium nitride, the sources of these charges being the substrate and metallic contact.

In addition, the prior art device emits weak light invisible in daylight at a sufficiently high supply voltage (10 to 30 V), which substantially limits the area of application of this device. In the known device, one should provide a complex light transmissive contact because of the radiant energy being absorbed in the silicon substrate, which complicates the manufacture of devices based thereon.

SUMMARY OF THE INVENTION

It is an object of the present invention to provide a semiconductor light-emitting device emitting violet shaded blue light visible in a brightly lit environment.

Another object of the invention is to bring the supply voltage of the device below 8 V.

Still another object of the invention is to reduce the electric field intensity at which light emission occurs.

Yet another object of the invention is to render the device easier in manufacture.

The invention resides in that, in a semiconductor light-emitting device, wherein a p-type gallium nitride layer is deposited on a substrate, according to the invention, the substrate is made of sapphire and deposited on the epitaxial layer of monocrystalline semiconductor gallium nitride is a layer of semiconductor n-type aluminum nitride, forming an injecting heterojunction with the semiconductor gallium nitride layer.

Preferably, the semiconductor gallium nitride and/or aluminum nitride layers should be semi-insulating.

The proposed semiconductor light-emitting device emits bright light in the wavelength range of 0.43 to 0.48 microns, is simple in design and easy in manufacture.

BRIEF DESCRIPTION OF THE DRAWINGS

Other objects and advantages of the invention will become more apparent from the following detailed description of specific embodiments thereof, taken in conjunction with the accompanying drawing which shows a semiconductor light-emitting device according to the invention.

DETAILED DESCRIPTION OF THE INVENTION

Referring now to the drawing, the semiconductor light-emitting device comprises a sapphire substrate 1 deposited whereon is an epitaxial layer 2 of monocrystalline semiconductor p-type gallium nitride GaN. Deposited on the layer 2 is a layer 2 of semiconductor n-type aluminum nitride AlN, forming an injecting heterojunction 4 together with the layer 2. An aluminum electrode 5 is deposited on the layer 3, and an indium electrode 6 is deposited on the layer 2.

The layer 2 is formed on the substrate 1 by vapor-phase epitaxial growth of monocrystalline gallium nitride, whereas the layer 3 is formed on the gallium nitride layer 2 by the plasma method.

The layers 2 and 3 may be made semi-insulating, which offers wider possibilities in producing the device.

As forward bias current is applied to the electrodes 5 and 6, charge carriers are injected into gallium nitride, owing to the injecting heterojunction 4 between the gallium nitride layer 2 and aluminum nitride layer 3, as well as to the charge carrier recombination in the gallium nitride layer 2. The light emission is brought out through the substrate 1 and from the aluminum nitride layer 3 serving as an optical window.

The proposed semiconductor light-emitting device features effective charge carrier injection at a low electric field intensity not exceeding $1.5.10^4$ V/cm, and a high uniformity of emission over the entire surface of the device, at bias voltages equal to 2.5 to 8 V.

For a better undestranding of the invention, the following examples of its practical embodiment are given by way of illustration.

EXAMPLE 1

The device comprises the following components:

(a) a sapphire substrate ($\alpha$-Al$_2$O$_3$) with orientation [0001], finished to grade 14 of accuracy, then exposed to a hydrogen flow at $t=1.500$ to $1.700°$ C.;

(b) an epitaxial monocrystalline semiconductor p-type gallium nitride layer with a carrier concentration of about $4.10^{19}$ cm$^{-3}$, orientation [0001], and a thickness of 18 microns;

(c) a semiconductor n-type aluminum nitride layer 0.1 micron thick;

(d) a first electrode 0.3 mm in diameter, formed by aluminum nitride layer;

(e) a second electrode formed by indium fused to the gallium nitride layer.

When a forward voltage of 5 to 8 V is applied to the electrodes, radiation from the sapphire substrate is initiated. The The radiant energy at the spectral band maximum is about 2.82 eV (T=300° K.).

EXAMPLE 2

The device comprises the following components:

(a) a sapphire substrate ($\alpha$-Al$_2$O$_3$) with orientation [0001];

(b) an epitaxial monocrystalline p-type gallium nitride layer with a free carrier concentration of about $4.10^{19}$ cm$^{-3}$, orientation [0001], and a thickness of 8 microns;

(c) a semiconductor n-type aluminum nitride layer 0.03 microns thick;

(d) a first electrode 0.3 microns in diameter, formed by aluminum deposited on the aluminum nitride layer;

(e) a second electrode formed by indium fused to the gallium nitride layer.

Application of a forward voltage of 2.5 to 5 V to the electrodes initiates radiation from the sapphire substrate.

The radiant energy at the spectral band maximum is about 2.76 eV (T=300° K.).

What is claimed is:

1. A semiconductor light-emitting device comprising: a sapphire substrate; an epitaxial layer of monocrystalline semiconductor p-type gallium nitride deposited on said substrate; a layer of semiconductor n-type aluminum nitride deposited on said semiconductor gallium nitride layer and forming therewith an injecting heterojunction ensuring emission toward said substrate; two electrodes whereto a bias voltage is applied; first said electrode being on said semiconductor gallium nitride layer; second said electrode being on said semiconductor aluminum nitride layer.

2. A semiconductor light-emitting device as claimed in claim 1, wherein said semiconductor gallium nitride layer is semi-insulating.

3. A semiconductor light-emitting device as claimed in claim 1, wherein said semiconductor aluminum nitride layer is semi-insulating.

4. A semiconductor light-emitting device as claimed in claim 2, wherein said semiconductor aluminum nitride layer is semi-insulating.